United States Patent [19]

Haight

[11] Patent Number: 4,908,583

[45] Date of Patent: Mar. 13, 1990

[54] ZERO PHASE STARTUP FOR A TANK TYPE VOLTAGE CONTROLLED OSCILLATOR

[75] Inventor: Michael H. Haight, Sherman, Tex.

[73] Assignee: Texas Instruments Incorporated, Dallas, Tex.

[21] Appl. No.: 217,504

[22] Filed: Jul. 11, 1988

[51] Int. Cl.⁴ .......................... H03B 5/12; H03L 3/00
[52] U.S. Cl. ................................ 331/117 R; 331/173
[58] Field of Search ............ 331/117 R, 117 FE, 167, 331/168, 172, 173

[56] References Cited

U.S. PATENT DOCUMENTS 3,991,388 11/1976 Harshbarger .................. 331/173 X
4,763,086 8/1988 Haight et al. ............... 331/117 R X
4,799,030 1/1989 Haight et al. .................. 331/117 R Primary Examiner—Siegfried H. Grimm
Attorney, Agent, or Firm—Carlton H. Hoel; Thomas W. DeMond; Melvin Sharp

[57] ABSTRACT

A self contained circuit to enable a tank type (coil/capacitor) voltage controlled oscillator to start up and free run from a known state. The circuit allows the oscillator to be stopped to within two periods by invoking its only input logic signal and also restarted with no adverse effects on its free running operation. It includes three current mirrors, one which sets the current for the other two mirrors and of the final two, one actively sets a bias on a coil (stops oscillation) while the other makes up for the lack of coil bias by providing an equivalent amount current influx to the oscillator in the free running condition.

16 Claims, 3 Drawing Sheets

ZERO PHASE STARTUP FOR A TANK TYPE VOLTAGE CONTROLLED OSCILLATOR

BACKGROUND OF THE INVENTION

1. Field of the Invention

This invention relates to tank type voltage controlled oscillator circuits and, more specifically, to such circuits capable of starting up and free running from a known initial state and being stopped within two periods of the oscillator response frequency by invoking a stop signal.

2. Brief Description of the Prior Art

Prior attempts to solve the problem of rapidly stopping the oscillation in a resonating coil/capacitor tank were generally avoided in such oscillator circuit designs. Prior art oscillator circuits generally employed a voltage controlled multivibrator which did not use the coil and therefore did not have the large amount of electrical inertia that is present in a tank type configuration. However, the use of such tank type oscillator circuits and their inertia are beneficial when voltage controlled oscillator noise immunity is considered.

One prior art circuit, which is set forth in FIG. 1, uses a different zero phase start up on an LC tank. When this circuit clamps or stops oscillation of the oscillator, the voltage across the resistor Rc and inductor L series combination is:

$V_{be67} + V_{be68} - V_{be66} - V_{diode}$ or approximately $V_{BE} - V_{schottky}$ diode which is approximately 300 mV.

where $V_{be67}$ is the voltage of the base with respect to the emitter of transistor Q67 and $V_{be68}$ and $V_{be66}$ are the same with respect to transistors Q68 and Q66 respectively and $V_{sdiode} = V_{schottky}$ diode which is the forward biased voltage drop of diode D104 (anode with respect to cathode)

Therefore, the clamp current is $$I_{clamp} = \frac{V_{BE} - V_{sdiode}}{R_c + R_{coil}}$$

The value of Iclamp must match the peak ac coil current, the reason being that any imbalance will affect release time of the clamp by affecting the duty cycle of the oscillator's first cycle.

The above noted circuit performs its intended function, however it also requires a clamp of the oscillator output because this clamp configuration usually required three to five full oscillator periods to stop the resonant oscillation of the LC tank (and its effect on the output). This presents a problem in many environments and applications.

SUMMARY OF THE INVENTION

In accordance with the present invention, the above noted problems of the prior art are minimized and there is provided a clamp or zero phase startup circuit which will stop the oscillation of the tank in one or two resonant periods, depending upon when during the resonant period the clamp is applied. The zero phase start-up circuit of the present invention also is set to the maximum peak current of the coil as in the prior art during free run. However, the fact that the voltage at the node coupled to the tank and emitter of the load mirror transistor Q4 driving the tank is changing with respect to the node coupled to the emitter of the other mirror transistor Q5 automatically adds to (and subtracts from during the other half period) the VBE of the mirror transistor coupled to and driving the tank. This effect will stop the oscillation faster than the zero phase startup circuit shown in the above noted prior art due to the fact that a lower impedance is shunted across the two tank nodes (2 and 3).

The start up circuit includes a pair of NPN transistor mirrors which are controlled by a PNP mirror. One of the NPN mirrors drives the tank via the emitter of one of the NPN transistors, the emitter of the other NPN transistor thereof being retained at a fixed voltage relative to reference voltage or ground by a plurality of series connected transistors which are connected as diodes.

The tank type voltage controlled oscillator zero phase start up circuit may easily be integrated with the requirement of only one external resistor for coil current setting (R1).

DESCRIPTION OF THE PREFERRED EMBODIMENT

Figure 1:
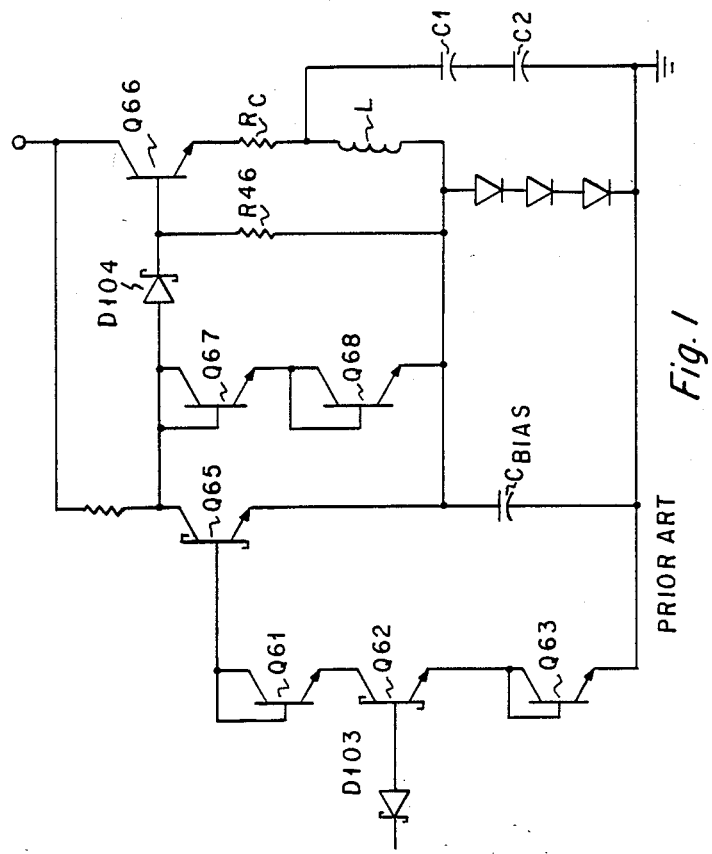
FIG. 1 is a circuit diagram of a typical prior art oscillator using zero phase start up.
Figure 2:
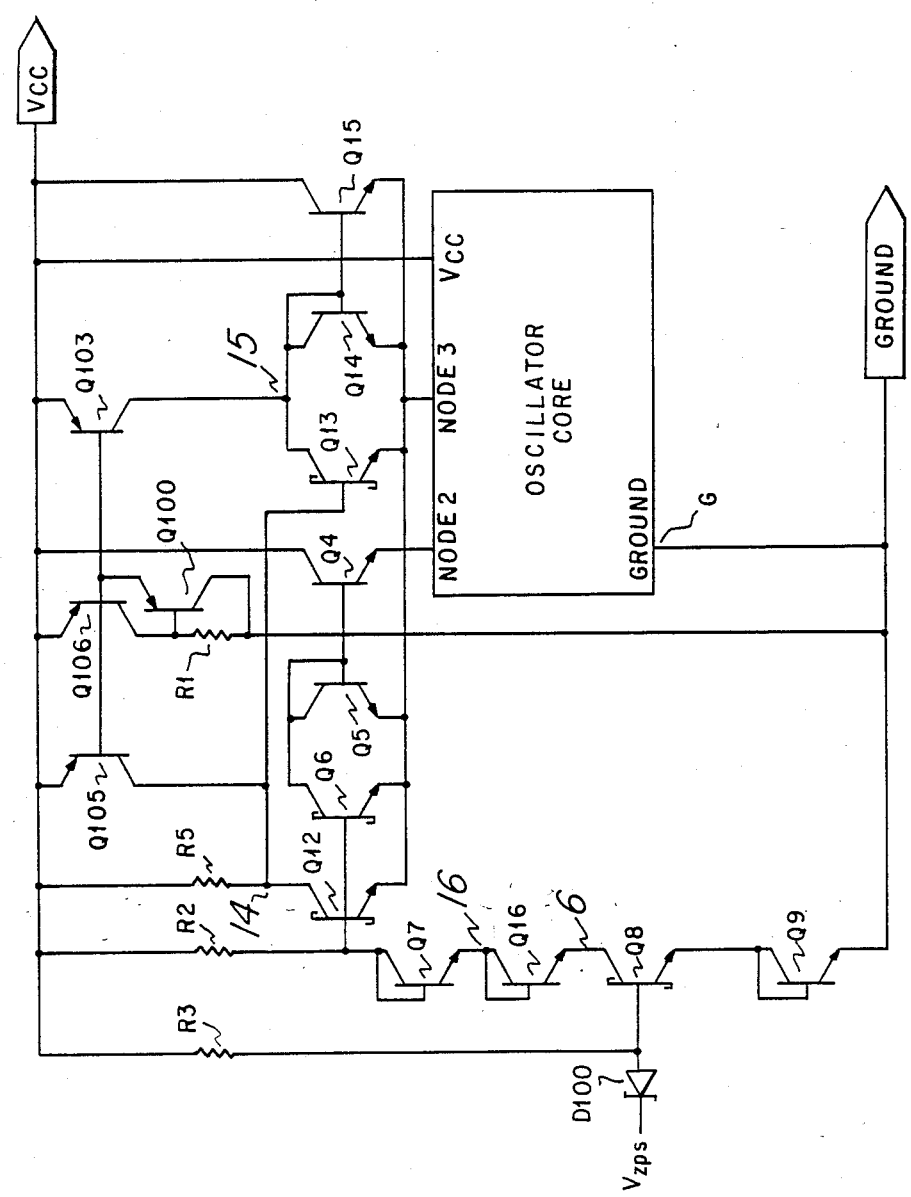
FIG. 2 is a block diagram of a standard prior voltage controlled oscillator with the starting and stopping circuit of the present invention for stopping oscillator oscillation and then starting up oscillator oscillation from a known state.

With reference first to FIG. 2, there is shown a block diagram of a standard voltage controlled oscillator 1 and the clamp circuit 3 in accordance with the present invention. The clamp circuit will control shut down of the oscillator within two oscillation periods and start up of the oscillator at a predetermined output logical state in the resonant period or cycle as will be described in detail hereinbelow.

Figure 3:
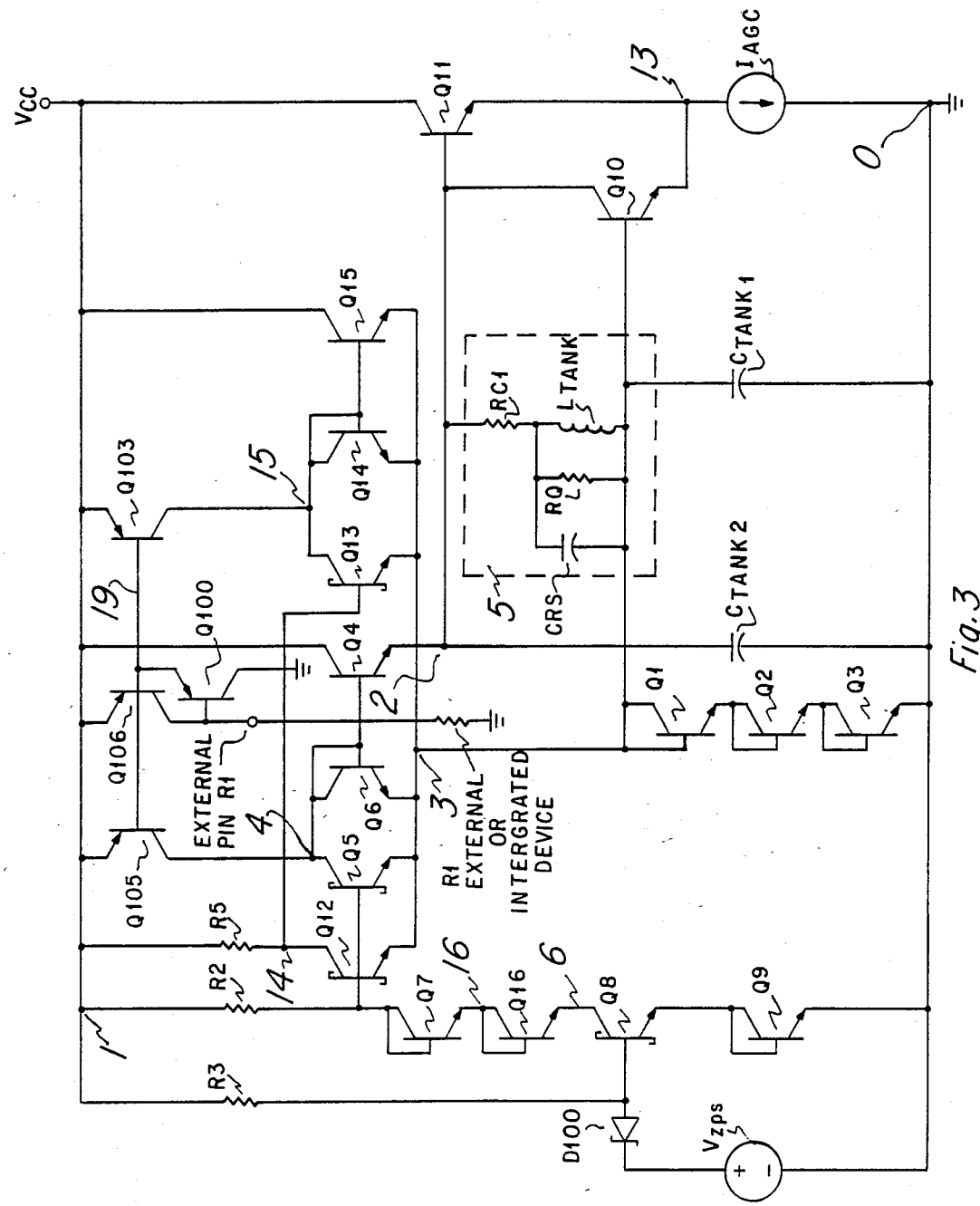
FIG. 3 is a circuit diagram of the oscillator start up circuit in accordance with the present invention including a portion of the oscillator circuit.

Referring to FIG. 3, there is shown the clamp circuit in accordance with a preferred embodiment of the present invention and a portion of the tank type oscillator circuit controlled therewith. In such tank type oscillator circuits, resonance takes place with a coil and a capacitor. The coil 5 of the oscillator is depicted in FIG. 3 by the equivalent circuit therefor which is composed of the components Rcl, Csr, Rq and Ltank, whereas the capacitor is Ctank2. The tank type oscillator circuit per se as utilized herein is well known and readily available on the market as a separate circuit. The oscillator therefore forms no part of this invention per se. Accordingly, the oscillator circuit will not be discussed in detail herein.

As stated above, there are applications wherein the oscillator must be stopped within one or two cycles and then restarted, this being selectably within the oscillator itself from a known state, such as, for example, a logic high or a logic low. The start up or clamp circuit herein provides the ability to accomplish such function by stopping operation of the coil and controlling its current flow.

In general, resonance does not start at the peak of the cycle. Resonance is a natural effect of an inductor and capacitor connected in a series or parallel configuration. However, in a tank type voltage controlled oscillator it is almost necessary to start free running (from a clamped or stopped state) with a direct current flowing through the inductor that is equal to its peak current while oscillating. It is merely necessary to simulate the normal operating conditions during the clamping. While the vast majority of tank type oscillators have an internal method for adjusting their own internal gain (AGC) to make up for various external influences, this internal method takes time, typically in excess of 100 oscillator cycles. This adjustment usually controls the inductor current by sensing the peak to peak voltage swing across the tank and then integrating over time so that the adjustment of the inductor current is small from one resonant cycle to the next. It is desirable to set the current as close as possible from the start because if the startup inductor current is too large, the oscillator internal circuitry will distort and the duty cycle (ratio of the time in a logical high state with respect to a logical low state) is unpredictable. If the startup current is too low, noise can become a problem, causing the oscillator output to become entirely unpredictable.

The clamp circuit 3 (FIG. 2) in accordance with a preferred embodiment of the present invention as shown in FIG. 3 comprises twin complementary switching NPN current mirrors whose switching is controlled by a single logic signal Vzps.

The first switchable mirror includes transistors Q4, Q5 and Q6 wherein transistor Q4 sets a current through the tank coil 5. In the clamped state, transistor Q5 sets the VBE of transistor Q4 being between nodes 4 and 3 and transistor Q6 turns off or allows the mirror to function by allowing the VBE of transistor Q5 to assume whatever VBE it should, based upon the collector current through transistor Q105.

The VBE of transistor Q4 is not only determined by transistor Q5, but also by whatever voltage is across the coil 5. It should also be noted that the maximum effect of the clamp on the coil 5 will occur during the second sinusoidal half period where Vnode 2 is less than or equal to Vnode 3 (thus increasing the VBE on transistor Q4 and its emitter current).

The second switchable current mirror comprises the transistors Q13, Q14 and Q15 where transistor Q13 turns off or allows the mirror to function by allowing the VBE of transistor Q14 to assume whatever value it should, based upon the collector current at transistor Q103. Transistor Q14 sets the VBE of transistor Q15 being between nodes 15 and (with respect to node) 3 whereas transistor Q15 sets an emitter current into node 3.

The reason for the existence of the second mirror is to assure the same amount of current through diode connected transistor stack Q1, Q2 and Q3 in the clamped and unclamped modes. This causes the voltage of node 3 to stand off from ground by 3 VBE (Q1, Q2, Q3). In addition to the three diodes, node 3 is protected from rapid change from this voltage by capacitor Ctank1 at the time of the switchover (but it will not prevent a change in Vnode3 due to a mismatch in the resultant current from the two NPN mirrors). Transistors Q6 and Q13 externally control whether their respective mirrors are turned on or off. In other words, to prevent such rapid change in the voltage of node 3 with respect to ground (node 0), switching mirror Q4, Q5 will affect the duty cycle of the oscillator and a similar mirror Q14, Q15 takes over so that the base and collector currents of transistors Q1, Q2 and Q3 stay the same (neglecting short term ac effects which capacitor Ctank1 takes care of) and Vnode3 stays as constant as possible.

Both of the NPN mirrors Q4, Q5 and Q14, Q15 are controlled by a third PNP mirror Q100, Q103, Q105 and Q106. The third mirror, composed of PNP lateral transistors is dc. Transistor Q100 is a helper transistor to reduce base current error effects of the lower hfe PNP lateral transistors. Transistor Q103 sets the amount of current for the switchable current mirror Q14, Q15 whose entire current flow is applied to node 3. Transistor Q105 sets the amount of current for the switchable current mirror Q4, Q5 whose current flow is into node 2, then through the inductor into node 3. Transistor Q106 sets the VBE for transistors Q103 and Q105 and essentially sets all the mirror currents. The PNP mirror Q100, Q103, Q105, Q106 is dc and is constantly on. The PNP mirror is utilized to control both of the NPN mirrors with a single resistor R1 so that only one pin which is coupled to resistor R1 will be required as an external component on an integrated version of this circuit. The transistors Q103 and Q105 can be sized to deliver any required current to the respective NPN mirrors to which they feed current.

In terms of the operation of the mirrors, it should be noted again that the two NPN switchable mirrors Q4, Q5, and Q14, Q15 operate in a reciprocating fashion to hold node 3 voltage as constant as possible. If the collector current of transistor Q105 is the same as the collector current of transistor Q103 which equals one unit, then:

1. the base current plus the collector of transistor Q5 plus the base current of transistor Q4 also equal one unit and also base current plus the collector current of transistor Q14 plus the base current of transistor Q15 equal one unit.

2. The desired clamp current is the emitter current of transistor Q4 which equals the sum of the base and collector currents of transistor Q4.

3. Vzps is the input logic signal selecting the clamped and unclamped conditions.

4. Transistors Q8, Q9 and diode D100 provide the desired level for the input logic threshold. This threshold is VbeQ9+VbeQ8−VforwardD100 and is approximately 1.1 volts.

5. Transistors Q7 and Q16 serve only to reduce the voltage swing on the collector of transistor Q8, hence speed up its switching speed.

6. Helper transistors may be employed to reduce base current error in both NPN switchable mirrors. The collector to base short circuit on transistors Q5 and Q14 should be replaced by a base and emitter connection of the helper transistor, respectively, where the collector of each helper is tied to Vcc.

Switching between the two NPN mirrors is accomplished through the voltage source Vzps which turns on and off transistor Q8. Transistor Q9 helps set the logic threshold level whereby the threshold level at the base of transistor Q8 is 2VBE−one forward biased diode schottky voltage drop.

When Vzps switches from a logic low to a logic high, transistor Q8 switches on, causing the voltage of nodes 6, 16 and 5 to drop, turning off transistors Q6 and Q12 since the voltage on node 5 is no longer large enough to sustain the conductive state thereof. Therefore, the node voltages at 14 and 4 rise to the maximum allowed by current limiting resistor R5 and current mirror transistor Q105 respectively. Transistors Q5 and Q13 then turn on. Since transistor Q5 is on, current mirror comprising transistors Q4 and Q5 is on with this mirror supplying the inductor with a fixed controlled current. Since transistor Q13 is also on, it in turn holds the voltage on node 15 at such a value that the current mirror comprising transistors Q14 and Q15 is turned off. In other words, transistor Q13 does not allow a large enough voltage to develop between nodes 15 and (with respect to node) 3 to allow anything more than a negligible collector current in either transistor Q14 or Q15 so that the mirror is turned off. When Vzps switches from a logic high to a logic low, transistor Q8 switches off, thereby causing the voltage of nodes 6, 16 and 5 to rise to the current limited value determined by resistor R2. This turns on transistors Q6 and Q12 because the voltage on node 5 is now large enough to place them not only in a conductive state but also in saturation. Hence the voltages at nodes 14 and 4 fall (with respect to node 3) to a saturation voltage of a bipolar transistor. Transistor Q5 and transistor Q13 both turn off because the saturation voltage across their base-emitter junctions will not allow them to conduct. The fact that transistor Q13 is turned off allows the voltage on node 15 to rise to a value limited by current source Q103 and transistor Q14. This turns transistor Q14 on. Since transistor Q14 is on, current mirror comprising transistors Q14 and Q15 is on with this mirror supplying node 3 with a fixed controlled current to insure that the voltage on node 3 stays as constant as possible.

Diode connected transistors Q1, Q2 and Q3 are provided to maintain a dc voltage from node 3 to ground. Capacitor Ctank 1 acts as a low pass filter in conjunction with these diode connected transistors to smooth (or filter) out any short term A.C. effects.

The core of the oscillator is made up of two gain producing devices, common base connected transistor Q10 and common collector connected transistor Q11. Since no resonant tank circuit is 100% efficient, transistors Q10 and Q11 provide just enough gain to override the losses in the tank and therefore sustain oscillation. The automatic gain control current Iagc is handled elsewhere in the circuit (not shown) in well known manner so as to override the loss to sustain oscillation.

Basically, when in oscillation, current flow is travelling back and forth through the inductor at the resonant frequency determined by the combination of capacitor Ctank2 and the coil 5. To stop the oscillation, a very low impedance shunt (essentially a short circuit) must be placed across the coil itself. Then, when oscillation is resumed, the current flow through the inductor must be reestablished by placing a direct current (d.c.) flow through the coil. The current that must be set in the coil is the peak current during oscillation. The value of resistor R1 sets the resonant current in mirror Q106, Q103, Q105 which in turn sets the two current NPN mirrors Q4, Q5 and Q14, Q15. The value of R1 is therefore critical and preset according to the known peak value of current through the coil.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modification.

I claim:

1. An oscillator system comprising:

(a) a tank type oscillator having a coil and a capacitor;
    (b) means to control the current in said coil comprising:
        first means coupled to one end of said coil to provide a substantially constant normal DC current through said coil providing a substantially constant normal DC voltage at said end of said coil;
        second means coupled to the other end of said coil to provide a substantially constant normal DC voltage at said other end of said coil; and
    means responsive to a predetermined condition to reciprocatingly operate said first and second means.

2. A system as set forth in claim 1 wherein said first means comprises a first current mirror circuit composed of at least a pair of NPN semiconductor devices.

3. A system as set forth in claim 1 wherein said second means comprises a second current mirror circuit composed of at least a pair of NPN semiconductor devices.

4. A system as set forth in claim 2 wherein said second means comprises a second current mirror circuit composed of at least a pair of NPN semiconductor devices.

5. A system as set forth in claim 1 further comprising means to control current flow through said first and second means.

6. A system as set forth in claim 5 wherein said means to control current flow through said first and second means comprises a current mirror circuit composed of at least a pair of PNP semiconductor devices.

7. A system as set forth in claim 2 further comprising means to control current flow through said first and second means.

8. A system as set forth in claim 7 wherein said means to control current flow through said first and second means comprises a current mirror circuit composed of at least a pair of PNP semiconductor devices.

9. A system as set forth in claim 3 further comprising means to control current flow through said first and second means.

10. A system as set forth in claim 9 wherein said means to control current flow through said first and second means comprises a current mirror circuit composed of at least a pair of PNP semiconductor devices.

11. A system as set forth in claim 4 further comprising means to control current flow through said first and second means.

12. A system as set forth in claim 11 wherein said means to control current flow through said first and second means comprises a current mirror circuit composed of at least a pair of PNP semiconductor devices.

13. A system as set forth in claim 6 wherein each of said PNP semiconductor devices is coupled to a different one of said first and second means.

14. A system as set forth in claim 8 wherein each of said PNP semiconductor devices is coupled to a different one of said first and second means.

15. A system as set forth in claim 10 wherein each of said PNP semiconductor devices is coupled to a different one of said first and second means.

16. A system as set forth in claim 12 wherein each of said PNP semiconductor devices is coupled to a different one of said first and second means.

* * * * *